(12) United States Patent
Hung et al.

(10) Patent No.: US 7,485,529 B2
(45) Date of Patent: Feb. 3, 2009

(54) METHOD OF FABRICATING NON-VOLATILE MEMORY

(75) Inventors: Chih-Wei Hung, Hsin-chu (TW); Cheng-Yuan Hsu, Hsinchu (TW); Da Sung, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/621,095

(22) Filed: Jan. 8, 2007

(65) Prior Publication Data
US 2007/0109851 A1    May 17, 2007

Related U.S. Application Data

(62) Division of application No. 10/904,478, filed on Nov. 12, 2004, now Pat. No. 7,180,128.

(30) Foreign Application Priority Data
May 12, 2004    (TW) ............................... 93113274 A

(51) Int. Cl.
H01L 21/336    (2006.01)
(52) U.S. Cl. ............................... 438/257; 257/E21.68
(58) Field of Classification Search ................. 438/257; 257/E21.68, E21.179
See application file for complete search history.

(56) References Cited

U.S. PATENT DOCUMENTS

2005/0087794 A1* 4/2005 Chen et al. ................. 257/315
2006/0040440 A1* 2/2006 Chen et al. ................. 438/201

* cited by examiner

*Primary Examiner*—Thao P. Le
(74) *Attorney, Agent, or Firm*—Jianq Chyun IP Office

(57) ABSTRACT

A method of fabricating a non-volatile memory is described. A substrate having stacked gate structures thereon is provided. Each stacked gate structure includes a select gate dielectric layer, a select gate and a cap layer. A source region and a drain region are formed in the substrate. The source region and the drain region are separated from each other by at least two stacked gate structures. A tunneling dielectric layer is formed over the substrate and then a first conductive layer is formed over the tunneling dielectric layer. The first conductive layer is patterned to form floating gates in the gaps between the stacked gate structures. After forming an intergate dielectric layer over the substrate, a second conductive layer is formed over the substrate. The second conductive layer is patterned to form mutually linked control gates in the gaps between neighboring stacked gate structures.

4 Claims, 9 Drawing Sheets

METHOD OF FABRICATING NON-VOLATILE MEMORY

CROSS-REFERENCE TO RELATED APPLICATION

This is a divisional application of patent application Ser. No. 10/904,478, filed on Nov. 12, 2004, which claims the priority benefit of Taiwan patent application serial no. 93113274, filed on May 12, 2004 and is now allowed as U.S. Pat. No. 7,180,128, granted on Feb. 20, 2007. The entirety of each of the above-mentioned patent applications is hereby incorporated by reference herein and made a part of this specification.

BACKGROUND OF THE INVENTION

1. Field of the Invention

The present invention relates to a semiconductor device. More particularly, the present invention relates to a method of manufacturing a non-volatile memory and a method of operating a non-volatile memory array.

2. Description of Related Art

Electrically erasable programmable read only memory (EEPROM) is a type of non-volatile memory that allows multiple data reading, writing and erasing operations. In addition, the stored data will be retained even after power to the device is removed. With these advantages, it has been broadly applied in personal computer and electronic equipment.

A typical EEPROM has a floating gate and a control gate fabricated using doped polysilicon. To prevent erroneous reading resulting from the over-erasure of the EEPROM during an erasing operation, a select gate is set up above the substrate on the sidewall of the control gate and the floating gate forming a so-called split-gate structure.

At present, the industry has developed an AG-AND memory cell array fabricated using a split-gate memory cells (refer to U.S. Pat. No. 6,567,315). FIG. 1 is a schematic cross-sectional view of a portion of a conventional AG_AND memory cell structure. As shown in FIG. 1, the AG-AND memory cell structure includes a substrate 100, a well region 102, an auxiliary gate transistor Qa1 (Qa2), a memory device Qm1 (Qm2) and source/drain regions 104a, 104b (104c) in the substrate 100 on one side of the auxiliary gate transistor Qa1 (Qa2) and the memory device Qm1 (Qm2) respectively. The auxiliary gate transistor Qa1 (Qa2) includes an auxiliary gate 106a and the memory device Qm1 (Qm2) includes a floating gate 108a (108b) and a word line 110. The word line 110 serves as a control gate for the memory device Qm1 (Qm2). The auxiliary gate transistor Qa1 (Qa2) and the memory device Qm1 (Qm2) together form a memory cell Q1 (Q2). In an AG-AND array, neighboring memory cells in the row direction use a common source/drain region.

To program memory cell Q1 of the aforementioned AG-AND memory cell array, a 13V bias voltage is applied to the word line 110, a 1V bias voltage is applied to the auxiliary gate 106a, a 0V bias voltage is applied to the source/drain region 104a and a 5V bias voltage is applied to the source/drain region 104b. Thus, electrons are injected into the floating gate 108a of the memory device Qm1 to program the memory cell Q1. Because a bias voltage is not applied to the auxiliary gate 106b, the memory cell Q2 is not programmed.

However, in the aforementioned AG-AND memory cell structure, a source/drain region (104a, 104b or 104c) is formed in the substrate 100 on each side of the memory cell Q1 (Q2). To prevent the source/drain region (104a, 104b or 104c) from getting too close to the conductive channels underneath the memory cell, the source/drain regions (104a, 104b or 104c) have to be separate from each other by a definite distance. This precludes any further miniaturization of the memory cell array.

SUMMARY OF THE INVENTION

Accordingly, the present invention is directed to a non-volatile memory, a non-volatile memory array and a manufacturing method thereof capable of simplifying the fabrication of non-volatile memory array. The non-volatile memory is also programmed using a source-side injection (SSI) method so that the average programming speed of the memory cells is increased and overall performance of the memory is improved.

The present invention is also directed to a non-volatile memory, a non-volatile memory array and a manufacturing method thereof capable of increasing the overlapping area between the floating gate and the control gate inside the memory. Hence, the coupling ratio of the gates inside the memory is increased and overall performance of the memory is improved.

The present invention is also directed to a non-volatile memory, a non-volatile memory array and a manufacturing method thereof capable of miniaturizing the memory cells and increasing overall level of integration of devices.

According to an embodiment of the present invention, the non-volatile memory includes a substrate, a first row of memory cells, a first source/drain region and a second source/drain region. The first row of memory cells further includes a plurality of stacked gate structures, a plurality of spacers, a plurality of control gates, a plurality of floating gates, a plurality of inter-gate dielectric layers and a plurality of tunneling dielectric layers. The stacked gate structures are formed on the substrate and separated from each other by a gap. Each stacked gate structure includes, from the substrate surface upward, a select gate dielectric layer, a select gate and a cap layer. The spacers are disposed on the sidewalls of the stacked gate structures respectively. The control gates are disposed over the substrate filling the gap between every pair of neighboring stacked gate structures. Furthermore, the control gates are connected together through a control gate line. The floating gates are disposed between every pair of neighboring stacked gate structures between the control gate and the substrate respectively. The inter-gate dielectric layers are disposed between the control gates and the floating gates respectively. The tunneling dielectric layers are disposed between the floating gates and the substrate. The first source/drain region and the second source/drain region are disposed in the substrate on each side of the first row of memory cells.

The aforementioned non-volatile memory further includes a second row of memory cells, a second source/drain region and a third source/drain region disposed on the substrate. The second row of memory cells is connected with the first row of memory cells by the second source/drain region, wherein the second row of memory cells have structures identical to the first row of memory cells. The third source/drain region is disposed in the substrate on the side of the second row of memory cells corresponding to the second source/drain region.

Since no contacts and device isolation structures are formed between various rows of memory cells in the non-volatile memory according to an embodiment of the present invention, the level of integration of the memory array is increased.

The present invention is also directed to a non-volatile memory array including a substrate, a plurality of rows of memory cells, a plurality of control gate lines, a plurality of select gate lines, a plurality of source lines and a plurality of drain lines. The rows of memory cells are aligned to form a memory array. Each row of memory cells further includes a plurality of stacked gate structures disposed on the substrate and separated from each other by a gap. Each stacked gate structure includes, from the substrate surface upward, a select gate dielectric layer, a select gate and a cap layer. The spacers are disposed on the sidewalls of the stacked gate structures. The floating gates are disposed in the gaps between every pair of neighboring stacked gate structures. The tunneling dielectric layer is disposed between the floating gate and the substrate. The control gates are disposed between every pair of neighboring stacked gate structures above the floating gate. The inter-gate dielectric layers are disposed between the control gates and the floating gates. The source/drain regions are disposed in the substrate just outside the outermost two stacked gate structures. The control gate lines connect all the control gates in the same row of memory cells., The select gate lines connect all the select gates in, the same column of memory cells. The source lines connect all the source regions in the same column. The drain lines connect all the drain regions in the same column.

In the aforementioned non-volatile memory array, the memory array can be further divided into at least a first memory block and a second memory block. The drains of each row of memory cells within the first memory block are connected together through a first drain line. Similarly, the drains of each row of memory cells within the second memory block are connected together through a second drain line. Furthermore, both the first memory block and the second memory block use a common source line.

The aforementioned memory cell array may utilize source-side injection to inject electrons into the floating gate of a selected memory cell and program the selected memory cell. Furthermore, the Fowler-Nordheim tunneling effect is utilized to pull the electrons trapped within the floating gate of the memory cells into the substrate so that all the data within the memory array are erased.

According to an embodiment of the present invention, there is no gap between the various memory cell structures in the non-volatile memory array. Hence, the level of integration of the memory cell array is increased.

Since no contacts and device isolation structures are formed between various rows of memory cells in the non-volatile memory array of the present invention, the level of integration of the memory array is increased.

The present invention is also directed to a method of fabricating a non-volatile memory. First, a substrate is provided. A plurality of stacked gate structures is formed on the substrate. Each stacked gate structure includes a select gate dielectric layer, a select gate and a cap layer. Thereafter, a source region and a drain region are formed in the substrate. The source region and the drain region are separated from each other by at least two stacked gate structures. A tunneling dielectric layer is formed over the substrate and then a first conductive layer is formed over the tunneling dielectric layer. The first conductive layer is patterned to form a plurality of floating gate in the gaps between the stacked gate structures. After forming an inter-gate dielectric layer over the substrate, a second conductive layer is formed over the substrate. The second conductive layer is patterned to form a plurality of mutually linked control gates in the gaps between neighboring stacked gate structures.

According to an embodiment of the present invention, the tunneling dielectric layer can be formed by performing a thermal oxidation process. Furthermore, an additional insulating layer may also be formed over the source/drain region.

According to an embodiment of the present invention, floating gates having concave opening is produced to increase the overlapping area between the floating gate and the control gate. Hence, the gate-coupling ratio of the memory cells is increased and the required operating voltage is lowered. Ultimately, the average operating speed of the memory cell is increased.

Furthermore, a thick insulating layer is also formed over the source region and the drain region. The insulating layer isolates the floating gate and the control gate above the source region and the drain region so that their effects on the source and the drain region are minimized. Since there is no need to perform an extra processing operation to remove the floating gate and the control gate above the source and the drain, the process of fabricating the non-volatile memory is very much simplified.

In addition, no device isolation structures are set up between various rows of memory cells. Hence, the number of processing steps can be reduced and the level of integration of the memory array can be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
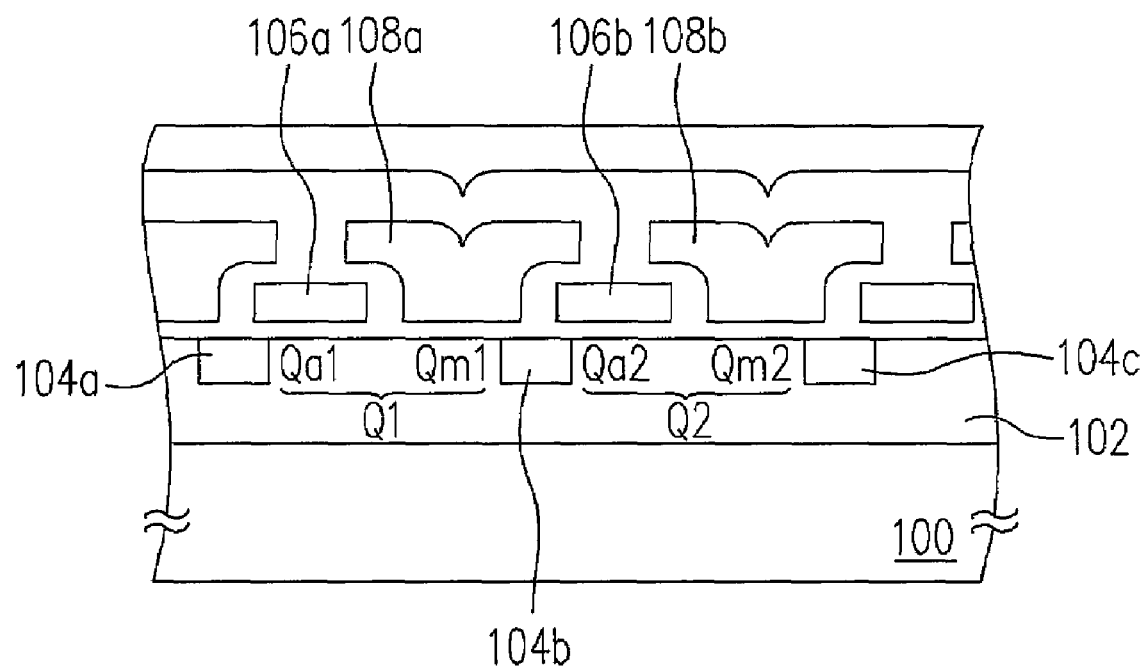
FIG. 1 is a schematic cross-sectional view of a portion of a conventional AG_AND memory cell structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
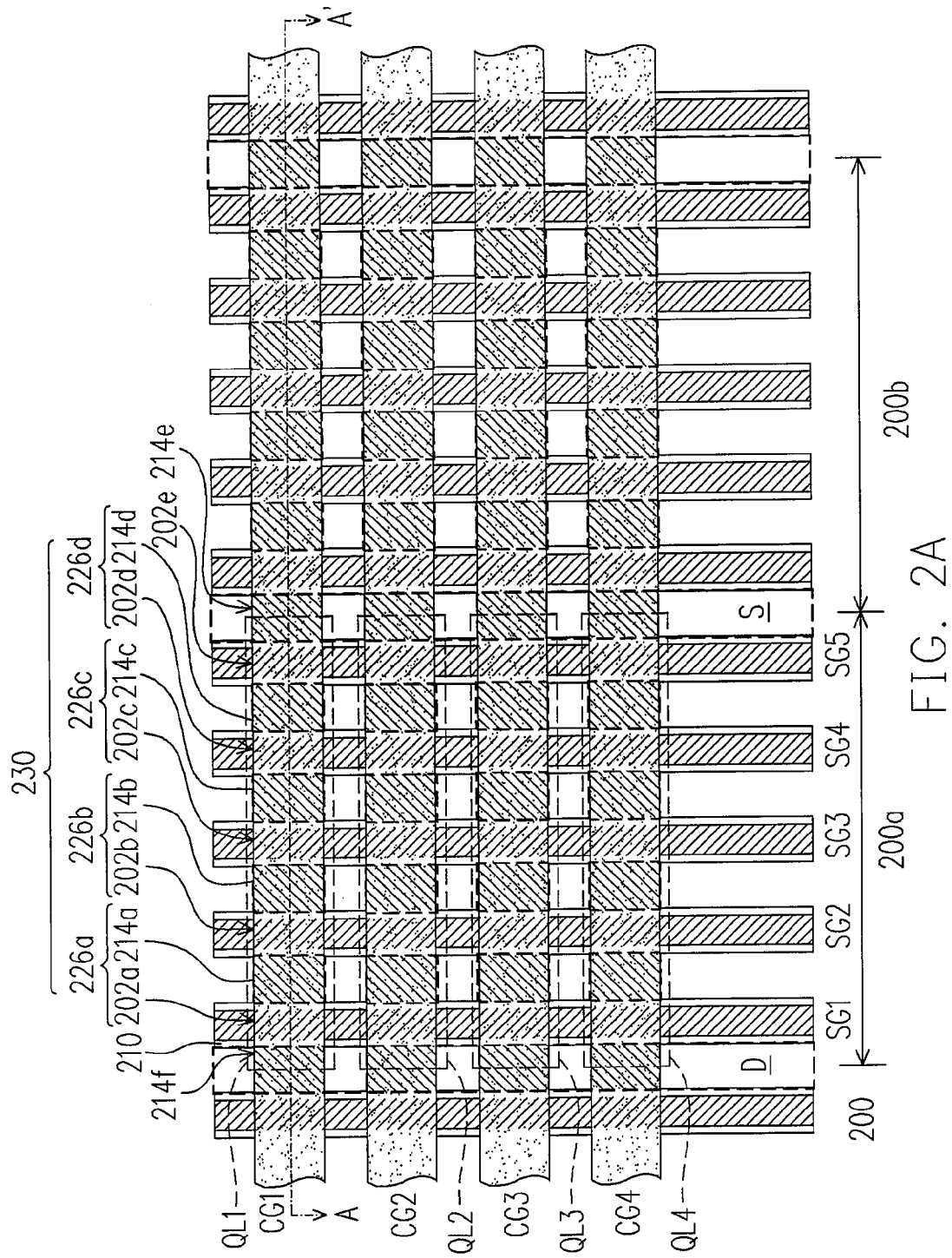
FIG. 2A is a top view of a non-volatile memory array according to an embodiment of the present invention.
Figure 2B:
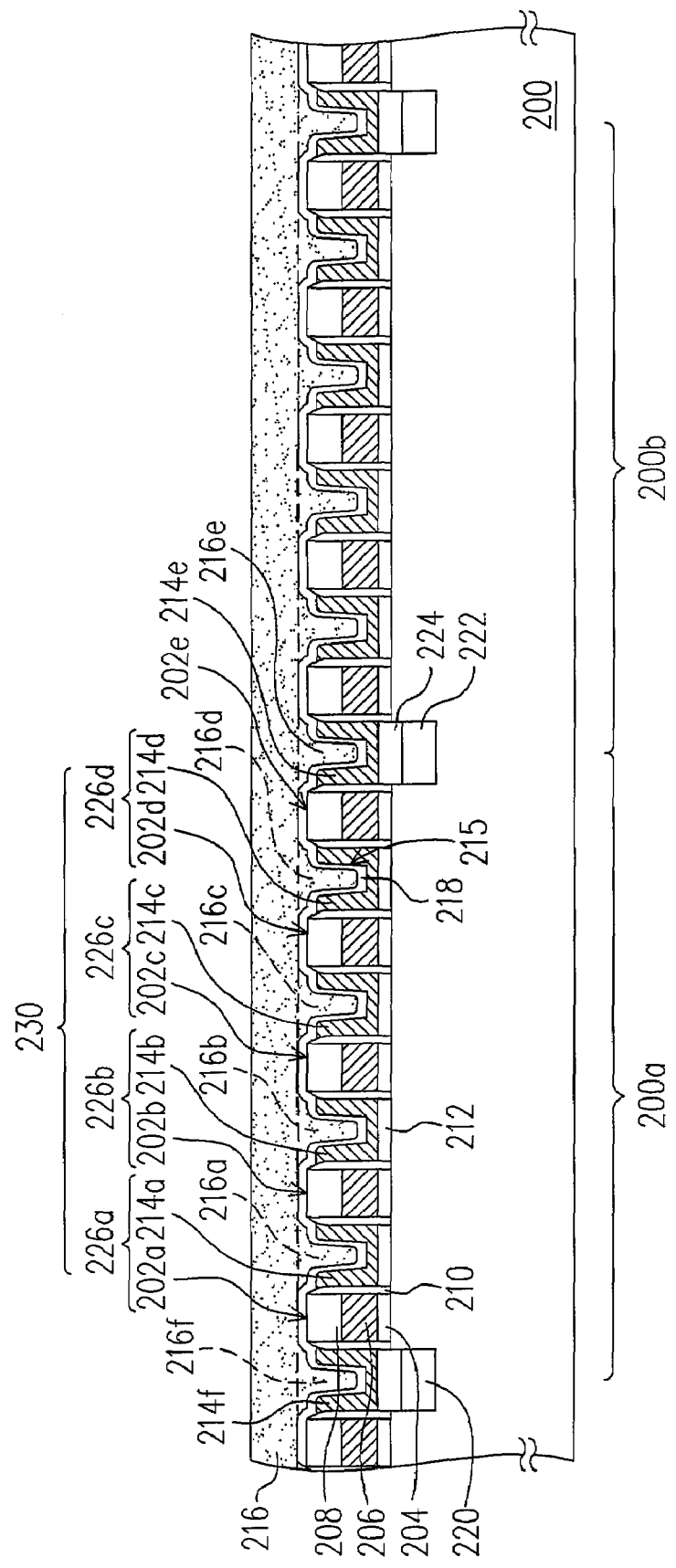
FIG. 2B is a schematic cross-sectional view along line A-A' of FIG. 2A.

FIG. 2A is a top view of a non-volatile memory array according to an embodiment of the present invention. FIG. 2B is a schematic cross-sectional view along line A-A' of FIG. 2A. As shown in FIGS. 2A and 2B, the memory array can be divided into a first memory block 200a and a second memory block 200b. The first memory block 200a and the second memory block 200b use a common source region 220 (the source line S). In the following, only the row of memory cells 200a is discussed.

As shown in FIG. 2A, the non-volatile memory array of the present invention includes a substrate 200, a plurality of rows of memory cells QL1~QL4, a plurality of control gate lines CG1~CG4, a plurality of select gate lines SG1~SG5, a source line S and a drain line D.

The rows of memory cells QL1~QL4 are aligned to form a memory array. The control gate lines CG1~GC4 connects the control gates of the memory cells in the same row. The select gate lines SG1~SG5 connects the select gates of the memory cells in the same column. The source line S connects all the source regions of the rows of memory cells in the same column. The drain line D connects all the drain regions of the rows of memory cells in the same column.

In the following, the rows of non-volatile memory cell structure are explained using a single row of memory cells QL1 as an example.

As shown in FIGS. 2A and 2B, the non-volatile memory structure of the present invention includes at least a substrate 200, a plurality of stacked gate structures 202a~202e (each of these stacked gate structures 202a~202e includes, from the substrate surface upward, a select gate dielectric layer 204, a select gate 206 and a cap layer 208), a plurality of spacers 210, a plurality of tunneling dielectric layer 212, a plurality of floating gates 214a~214f, a plurality of control gates 216a~216f, a plurality of inter-gate dielectric layers 218, a plurality of source regions 210 and a plurality of drain regions 222.

The substrate 200 is a silicon substrate, for example. The stacked gate structures 202a~202e are disposed on the substrate 200. Each stacked gate structure is a linear strip having a thickness between 2000 Å to 3500 Å, for example. The select gate dielectric layer 204 having a thickness between 160 Å~170 Å is formed by silicon oxide, for example. The select gate 206 having a thickness between 600 Å to 1000 Å is formed by doped polysilicon, for example. The cap layer 208 having a thickness between 1000 Å to 1500 Å is formed by silicon oxide, for example. The spacer is disposed on the sidewalls of the stacked gate structures 202a~202e. The spacer is formed by silicon oxide or silicon nitride, for example.

The control gates 216a~216d are disposed on the substrate 200 filling the gap between every pair of neighboring stacked gate structures 202a~202e. Furthermore, the control gates 216a~216d are connected together through the control gate lines 216. The control gates 216a~216d and the control gate lines 216 are formed together as an integrative unit. In other words, the control gates 216a~216d extend over the stacked gate structures and link with each other to form the control gate lines 216. The control gate lines 216 is roughly perpendicular to the stacked gate structures 202a~202e. The control gates 216a~216d are formed by doped polysilicon, for example.

The floating gates 214a~214d are disposed in the gaps between every pair of neighboring stacked gates 202a~202e and positioned between the control gates 216a~216d and the substrate 200. Each of the floating gates 214a~214d has a concave opening 215, for example. Furthermore, the upper surface of the floating gates 214a~214d are located on one side of the stacked gate structure 202a~202e between the upper surface of the select gate 206 and the upper surface of the cap layer 208. Typically, the floating gates 214a~214d are formed by doped polysilicon, for example.

The tunneling dielectric layer 212 is disposed between the floating gates 214a~214d and the substrate 200. Typically, the tunneling dielectric layer is a silicon oxide layer having a thickness between 60 Å~90 Å, for example. The inter-gate dielectric layer 218 is disposed between the control gates 216a~216d and the floating gates 214a~214d. Typically, the inter-gate dielectric layer 218 is a composite layer including a silicon oxide, silicon nitride and silicon oxide layer each having a thickness of about 70 Å. Obviously, the inter-gate dielectric layer 218 can be a composite layer including a silicon oxide and a silicon nitride layer. The inter-gate dielectric layer 218 also covers the upper surface of the stacked gate structures 202a~202e.

The stacked gate structures 202a~202e, the spacers 210, the tunneling dielectric layers 212, the floating gates 214a~214d, the control gates 216a~216d and the inter-gate dielectric layer together constitute a row of memory cells 230. The source region 222 and the drain region 220 are disposed in the substrate 200 on each side of the row of memory cells 230. For example, the drain region 220 is disposed in the substrate 200 on one side of the stacked gate structure 202a while the source region 222 is disposed in the substrate 200 on one side of the stacked gate structure 202e. In other words, the drain region 220 and the source region 222 are disposed in the substrate 200 just outside the two outermost stacked gate structures (202a and 202e) of the row of connected memory cells 230.

In the aforementioned row-connected memory cell structure 230, the stacked structures including control gates 216a~216d and floating gates 214a~214d respectively and the stacked gate structures 202a~202d together form memory cell structures 226a~226d. The stacked gate structure 202e closest to the source region 222 also serves as a switching transistor. Because there is no gap between memory cell structures 226a~226d and the stacked gate structure 202e, the row of memory cells can have a higher level of integration. Furthermore, an insulating layer 224 is disposed over the drain region 220 and the source region 222 respectively. The insulating layer 224 is fabricated using silicon oxide, for example. The insulating layer 224 serves to isolate the stacked gate structure including the control gate 216f and the floating gate 214f and the drain region 220 as well as the stacked gate structure including the control gate 216e and the floating gate 214e and the source region 222. Hence, the operation of the control gate 216f and the floating gate 214f above the drain region 220 and the control gate 216e and the floating gate 214e above the source region 222 have no effect on the drain region 220 and the source region 222 respectively.

Furthermore, because the floating gates 214a~214d all have a concave opening 215, overlapping area between various floating gates 214a~214d and their corresponding control gates 216a~216d is increased thereby increasing their gate-coupling ratio. In other words, the memory cells can have a lower operating voltage, a higher operating speed and a better overall performance.

In the aforementioned embodiment, four memory cell structures 226a~226d are serially connected together. Clearly, the number of memory cells that are serially connected together may vary according to actual requirements. For example, the same control gate line may link together 32 to 64 memory cell structures.

Furthermore, in the memory cell array shown in FIG. 2A, no device isolation structures or contacts are fabricated between various rows of memory cells. Thus, the level of integration of the memory array is increased.

Figure 3A:
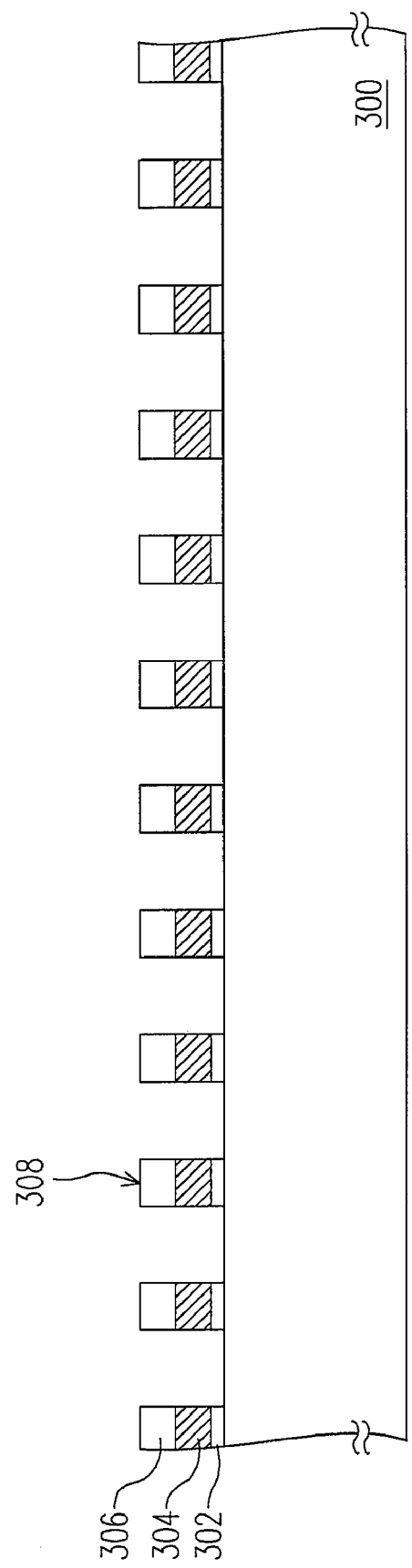
FIGS. 3A through 3E are schematic cross-sectional views along a line A-A' of FIG. 2A showing the steps for fabricating a non-volatile memory according to an embodiment of the present invention.

FIGS. 3A through 3E are schematic cross-sectional views along a line A-A' of FIG. 2A showing the steps of fabricating a non-volatile memory according to one preferred embodiment of the present invention. First, as shown in FIG. 3A, a substrate 300 such as a silicon substrate is provided. A plurality of stacked gate structures 308 each including a dielectric layer 302, a conductive layer 304 and a cap layer 306 is formed over the substrate 300. The stacked gate structures 308 are formed, for example, by depositing dielectric material, conductive material and cap material in sequence over the substrate 300 and patterning the dielectric layer, the conductive layer and the cap layer in photolithographic and etching processes thereafter. The dielectric layer is a silicon oxide layer formed, for example, by performing a thermal oxidation process. The conductive layer is a doped polysilicon layer formed, for example, by performing a chemical vapor deposition process and implanting ions into the doped polysilicon layer thereafter. The cap layer is a silicon oxide layer formed, for example, by performing a chemical vapor deposition process using tetra-ethyl-ortho-silicate (TEOS)/ozone ($O_3$) as the gaseous reactants. The conductive layer 304 serves as a select gate and the dielectric layer 302 serves as a select gate dielectric layer.

Figure 3B:
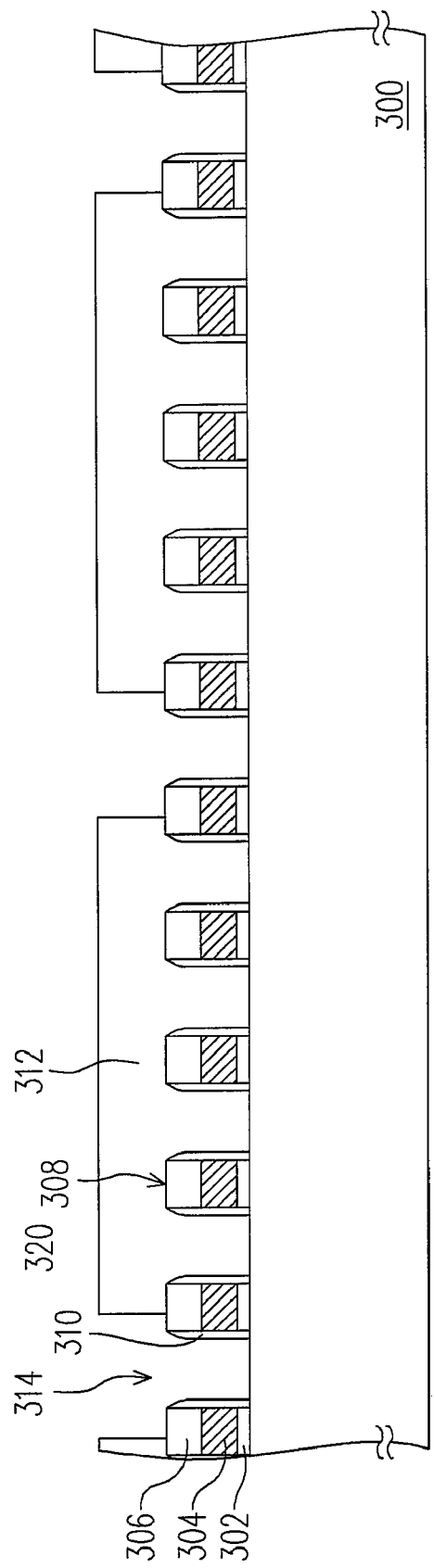

As shown in FIG. 3B, a spacer 310 is formed on the sidewall of the stacked gate structures 308. The spacers 310 are silicon oxide or silicon nitride layers are formed, for example, by depositing insulating material over the substrate and performing an anisotropic ion etching process thereafter. A mask layer 312 is formed over the substrate 300. The mask layer 312 has openings 314 that expose the areas on the substrate 300 for forming a source region 316 and a drain region 318. Typically, the mask layer 312 is a photoresist layer. Thereafter, using the mask layer 312 as a mask, a source region 316 and a drain region 318 are formed in the substrate 300 by performing an ion implantation process, for example. The source region 316 and the drain region 318 are separated from each other by at least two stacked gate structures 308.

After removing the mask layer 312, a tunneling dielectric layer 320 is formed over the substrate 300 and an insulating layer 322 is formed over the source region 316 and the drain region 318. The tunneling dielectric layer 320 and the insulating layer 322 are silicon oxide layer formed by performing a thermal oxidation process, for example. The source region 316 and the drain region contain dopants, the oxidation rate is higher than other areas free of dopants since the insulating layer 322 is formed over the source region 316 and the drain region 318. Consequently, the insulating layer 322 has a thickness greater than the tunneling dielectric layer 320.

Figure 3C:
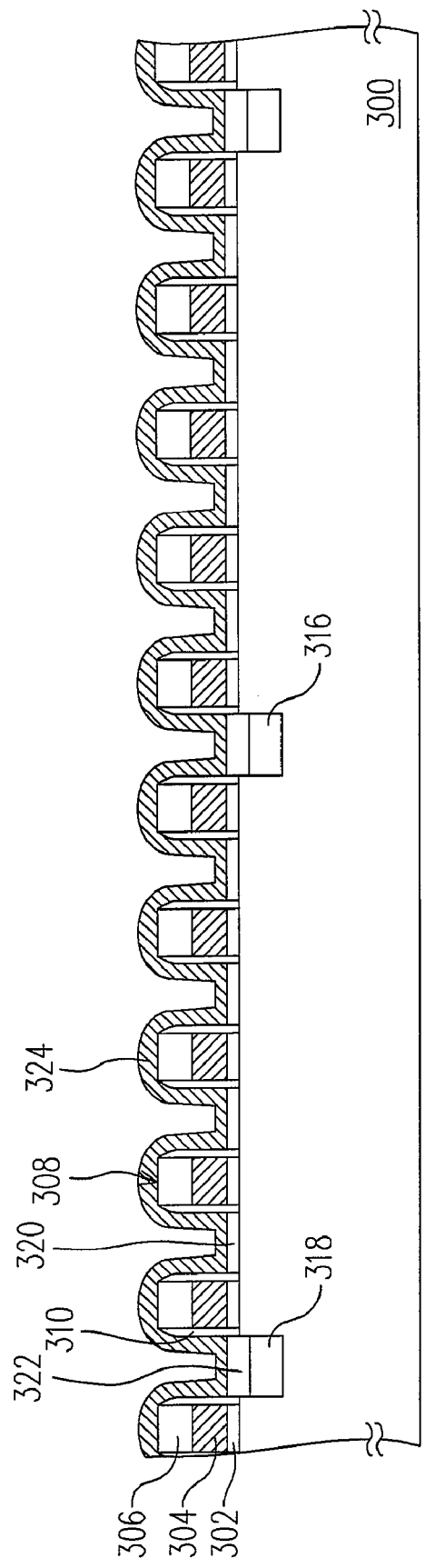

As shown in FIG. 3C, another conductive layer 324 is formed over the substrate 300. The conductive layer is a doped polysilicon layer formed, for example, by depositing an undoped polysilicon layer over the substrate in a chemical vapor deposition and then performing an ion implantation process. The conductive layer 324 is a conformal layer over the substrate 300 such that the gap between neighboring stacked gate structures 308 is unfilled.

Figure 3D:
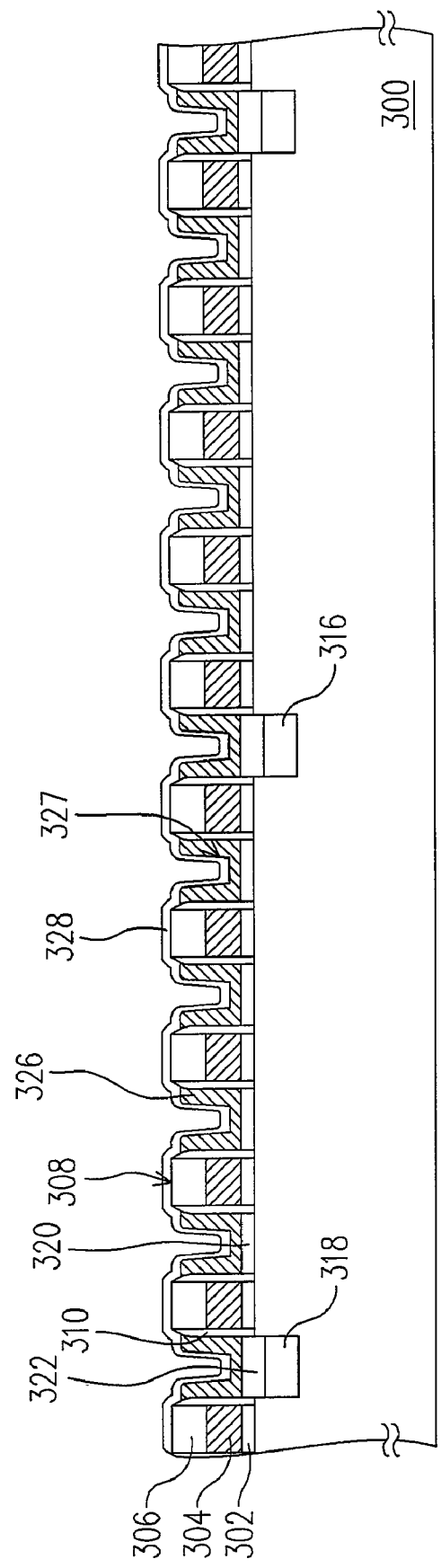

As shown in FIG. 3D, the conductive layer 324 is patterned to form a plurality of floating gates 326. The floating gates 326 are formed, for example, by depositing a material over the substrate 300 to form a material layer (not shown) that completely fills the gaps between the stacked gate structures 308. The material layer has an upper surface lying between the upper surface of the cap layer 306 and the upper surface of the conductive layer 304. The material layer is a photoresist layer or an anti-reflection coating formed, for example, by spin coating to form the material layer and then etching back the material layer. Thereafter, using the material layer as a mask, a portion of the conductive layer 324 is removed. Hence, the upper surface of the connective sections between the conductive layer 324 and the stacked gate structures 308 is located between the upper surface of the conductive layer 304 and the cap layer 306. After removing the material layer, photolithographic and etching processes are carried out to remove a portion of the conductive layer 324 so that the conductive layer 324 is dissected into a plurality of blocks thereby forming floating gates 326 between the stacked gate structures 308. Each floating gate 326 has a concave opening 327 for increasing the overlapping area with a subsequently formed control gate.

In the process of forming the floating gates 326 according to another embodiment, a portion of the conductive layer 324 can be directly removed by performing an etching back process instead of using the material layer so that the conductive layer 324 has an upper surface between the conductive layer 304 and the cap layer 306. Thereafter, a portion of the conductive layer 324 is removed to dissect the conductive layer 324 into separate blocks of floating gates 326.

In the process of forming the floating gates 326 according to yet another embodiment, the step of dissecting the conductive layer 324 into a plurality of blocks is skipped altogether. Instead, the conductive layer 324 is dissected to form a plurality of floating gates 326 later on in a subsequent process for fabricating the control gate by using the control gate as a mask.

Thereafter, an inter-gate dielectric layer 328 is formed over the substrate 300. The inter-gate dielectric layer 328 is a silicon oxide, silicon nitride, silicon oxide composite layer, for example. The inter-gate dielectric layer is formed, for example, by performing a thermal oxidation process to form a silicon oxide layer and then forming a silicon nitride layer and another silicon oxide layer in sequence in a chemical vapor deposition process.

Figure 3E:
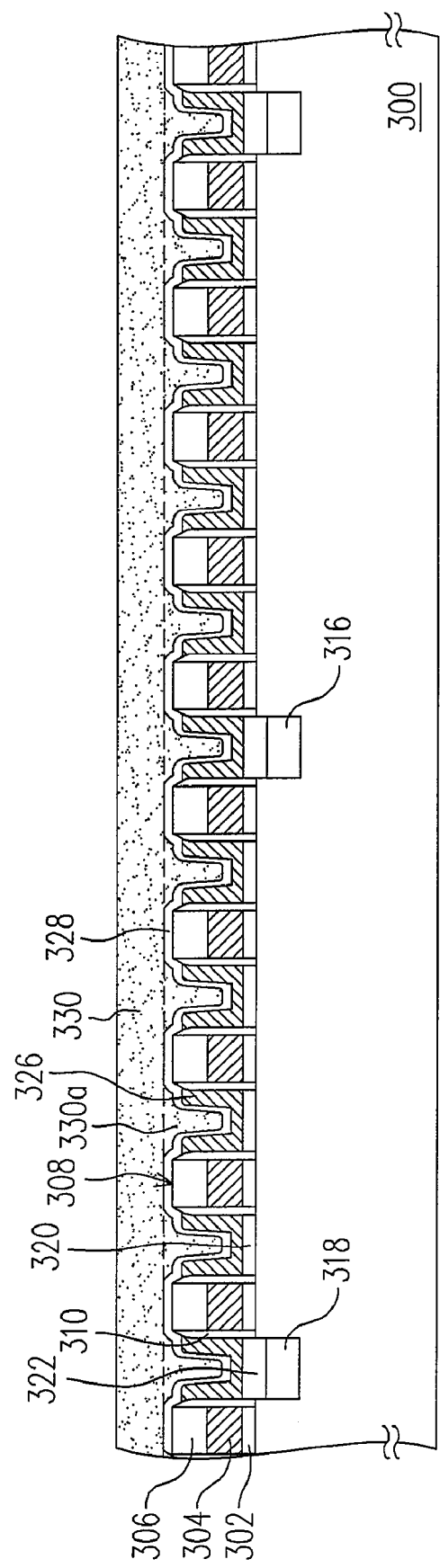

As shown in FIG. 3E, another conductive layer (not shown) is formed over the substrate 300. The conductive layer completely fills the gaps between the stacked gate structures 308. The conductive layer is formed, for example, by depositing conductive material over the substrate and performing a chemical-mechanical polishing or an etching back process to planarize the conductive material layer. The conductive layer is a doped polysilicon layer formed, for example, by depositing undoped polysilicon material to form an undoped polysilicon layer in a chemical vapor deposition process and then implanting ions to transform the undoped polysilicon layer into a doped polysilicon layer. Thereafter, the conductive layer is patterned to form a word line 330 such that the word line 330 fills the gaps between the stacked gate structures 308. The control gate line 330 above the floating gate 326 serves as a control gate 330a. In other words, the control gate 330a extends into the surface of the stacked gate structure 308 to connect with each other. Thereafter, a few more steps are still required to complete the process of fabricating the memory array. Since these are conventional steps, detailed descriptions are omitted.

In the aforementioned embodiment, all floating gates 326 have a concave opening so that the overlapping area between the floating gate 326 and the control gate 330a is increased. Hence, the gate-coupling ratio of the memory cells is increased and the required operating voltage is lowered. Ultimately, the average operating speed of the memory cell is increased.

Furthermore, a thick insulating layer 322 is also formed over the source region 316 and the drain region 318. The insulating layer 322 isolates the floating gate 326 and the control gate 330a above the source region 316 and the drain region 318 so that their effects on the source region 316 and the drain region 318 are minimized. Since there is no need to perform an extra processing operation to remove the floating gate 326 and the control gate 330a above the source 316 and the drain 318, the process of fabricating the non-volatile memory is simplified.

In addition, no device isolation structures are set up between various rows of memory cells. Hence, the number of processing steps can be reduced and the level of integration of the memory array can be increased.

In the aforementioned embodiment, four memory cell structures are serially connected together. Clearly, the number of memory cells that are serially connected together in a row may vary according to actual requirements. For example, a single bit line may link together 32 to 64 memory cell structures. Furthermore, the method of fabricating a row of memory cells can be directly applied to manufacture an entire memory cell array.

Figure 4:
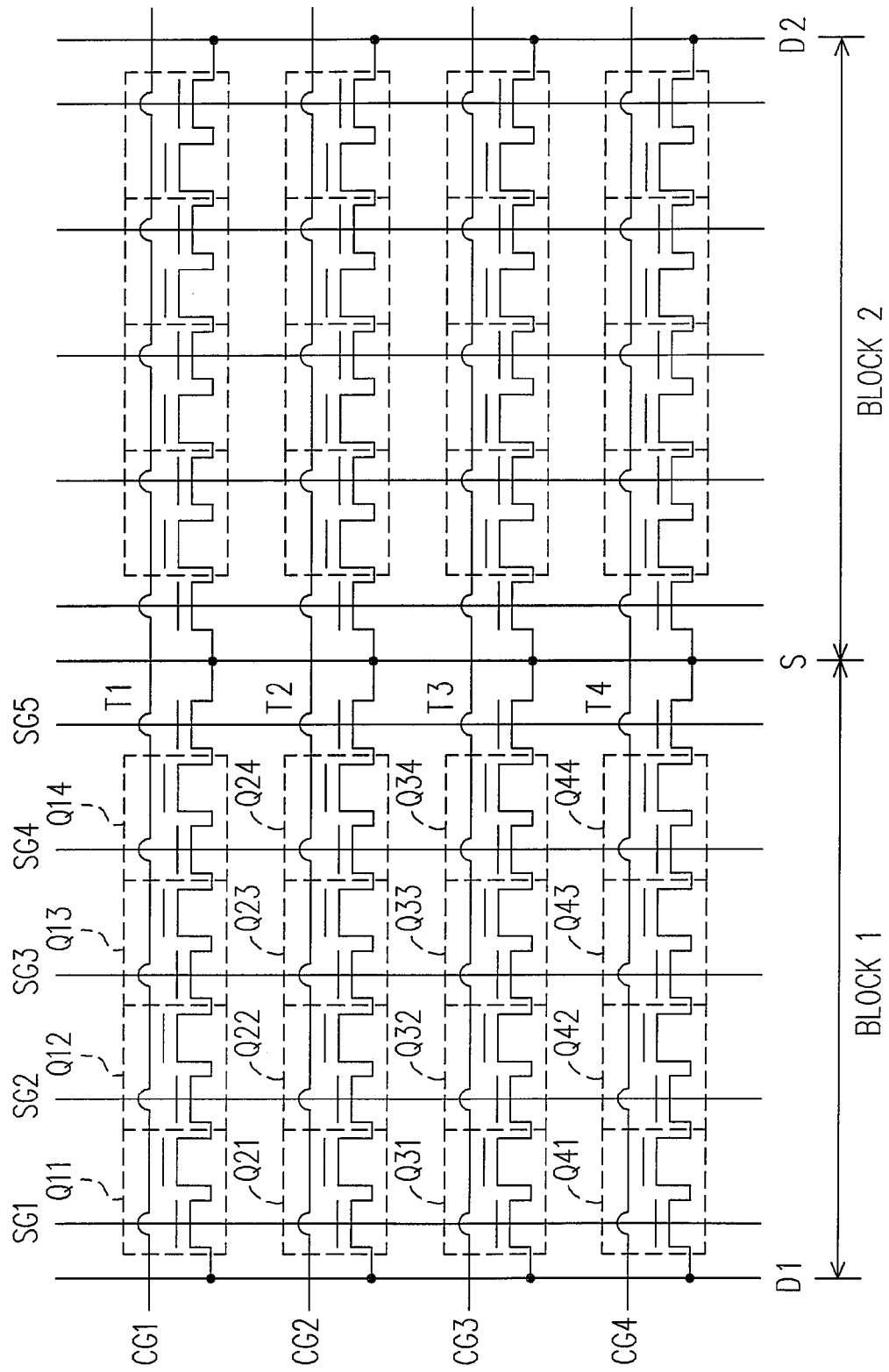
FIG. 4 is a simplified circuit diagram of a non-volatile memory array according to an embodiment of the present invention.

FIG. 4 is a simplified circuit diagram of a non-volatile memory array according to the present invention. In FIG. 4, the memory is divided into a first memory block BLOCK1 and a second memory block BLOCK2. In the following, the memory block BLOCK1 having altogether 16 memory cells is used as an example to illustrate the operation of a memory array in the present invention.

As shown in FIG. 4, there are 16 memory cells Q11~Q44, four switching transistors T1~T4, five select gate lines SG1~SG5, four control gate lines CG1~CG4, a source line S and a drain line D in the memory block BLOCK1. Each of the memory cells Q11~Q44 has a select gate, a control gate and a floating gate. The source line S and the drain line extend in the column direction. In the column direction, the drain line D and the source line S link up a plurality of memory cells. Each row of memory cells includes four memory cells and a switching transistor serially connected together. For example, the memory cells Q11~Q14 and the switching transistor T1 are serially connected together. Similarly, the memory cells Q21~Q24 and the switching transistor T2 are serially connected together, the memory cells Q31~Q34 and the transistor T3 are serially connected together and the memory cells Q41~Q44 and the transistor T4 are serially connected together.

The control gate lines CG1~CG4 connect all the control gates of the memory cells in various rows. For example, the control gate line CG1 connects the control gates of the memory cells Q11~Q14. Similarly, the control gate line CG2 connects the control gates of the memory cells Q21~Q24, the control gate line CG3 connects the control gates of the memory cells Q31~Q34 and the control gate line CG4 connects the control gates of the memory cells Q41~Q44.

The select gates SG1~SG4 connect the select gates of the memory cells in various columns. For example, the select gate SG1 connect the select gates of the memory cells Q11~Q41. Similarly, the select gate SG2 connect the select gates of the memory cells Q12~Q42, the select gate SG3 connect the select gates of the memory cells Q13~Q43 and the select gate SG4 connect the select gates of the memory cells Q14~Q44. In addition, the select gate SG5 connects the gates of the switching transistors T1~T4 in the same column.

To program the memory cells Qn2, for example, a 5V bias voltage is applied to the source line S, a 1.5V bias voltage is applied to the selected gate line SG2, an 8V bias voltage is applied to the non-selected gate lines SG1, SG3 and SG4, an 8V bias voltage is applied to the select gate line SG5, a 10~12V bias voltage is applied to the control gate line CG1, a 0~−2V bias voltage is applied to the non-selected control gate lines CG2, CG3 and CG4 and the substrate and the drain line D is connected to a ground. Hence, a source-side injection (SSI) is triggered to inject electrons into the floating gates of the memory cells thereby programming the memory cells Qn2.

To read data from the memory, a 0V bias voltage is applied to the source line S, a 4.5V bias voltage is applied to the select gate lines SG1~SG5, a 3V bias voltage is applied to the control gate line CG1 and a 2V bias is applied to the drain line D. Because the channel of memory cells with floating gate having a net negative charge will block the passage of a current and the channel of memory cells with floating gate having a net positive charge will facilitate the passage of a current, the channel on/off state or the size of the channel current can be used to determine the binary data '1' or '0' stored inside the memory cells.

To erase data from the memory cells, a −20V bias voltage is applied to the control gate line CG1 and a 0V bias voltage is applied to the substrate so that the Fowler-Nordheim (F-N) tunneling effect can be utilized to pull trapped electrons within the floating gate of the memory cells into the substrate.

In the operating mode of the memory cell array according to the present invention, the hot carrier effect is utilized to program a single bit of data into a single memory cell but the F-N tunneling effect is utilized to erase the data in the entire memory cell array. Hence, the electron injection efficiency is relatively high. In other words, the operating memory cell current is lowered and the operating speed is increased. With a reduction in the memory cell current, the average power consumption of the memory chip is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory, comprising the steps of:
   providing a substrate;
   forming a plurality of stacked gate structures on the substrate, wherein the stacked gate structures are separated from each other by a gap, and each stacked gate structure comprises a select gate dielectric layer, a select gate and a cap layer;
   forming a source region and a drain region in the substrate, wherein the source region and the drain region are formed separate from each other by at least two stacked gate structures;
   forming a tunneling dielectric layer over the substrate between every two stacked gate structures, and forming an insulating layer over the source region and the drain region, wherein the insulating layer has a thickness greater than a thickness of the tunneling dielectric layer;
   forming a first conductive layer over the substrate;
   patterning the first conductive layer to form a plurality of floating gates between every two neighboring stacked gate structures;
   forming an inter-gate dielectric layer over the substrate;
   forming a second conductive layer over the substrate; and
   patterning the second conductive layer to form a plurality of mutually connected control gates in the gap between every two neighboring stacked gate structures.

2. The method of claim 1, further comprising a step of forming a plurality of spacers on the sidewalls of the stacked gate structures after the step of forming the stacked gate structures on the substrate.

3. The method of claim 1, wherein the step of forming the tunneling dielectric layer over the substrate comprises performing a thermal oxidation process.

4. The method of claim 1, wherein the step of forming the source/drain region comprises performing an ion implantation process.

* * * * *